United States Patent
Sorg

(10) Patent No.: US 7,102,213 B2
(45) Date of Patent: Sep. 5, 2006

(54) LEADFRAME-BASED HOUSING, LEADFRAME STRIP, SURFACE-MOUNTED OPTOELECTRONIC-COMPONENT, AND PRODUCTION METHOD

(75) Inventor: Jörg Erich Sorg, Regensburg (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 10/527,836

(22) PCT Filed: Sep. 5, 2003

(86) PCT No.: PCT/DE03/02953

§ 371 (c)(1),
(2), (4) Date: Mar. 15, 2005

(87) PCT Pub. No.: WO2004/027882

PCT Pub. Date: Apr. 1, 2004

(65) Prior Publication Data

US 2006/0157828 A1 Jul. 20, 2006

(30) Foreign Application Priority Data

Sep. 17, 2002 (DE) .............................. 102 43 247

(51) Int. Cl.
*H01L 23/495* (2006.01)
*H01L 23/043* (2006.01)
*H01L 23/24* (2006.01)

(52) U.S. Cl. ...................... 257/667; 257/680; 257/687; 438/123; 438/124; 438/116

(58) Field of Classification Search ................ 257/667, 257/680, 687, 100
See application file for complete search history.

(56) References Cited

U.S. PATENT DOCUMENTS

| | | | | |
|---|---|---|---|---|
| 4,482,915 A | * | 11/1984 | Nishikawa et al. | 257/669 |
| 4,791,472 A | * | 12/1988 | Okikawa et al. | 257/669 |
| 4,803,544 A | | 2/1989 | Holzschuh et al. | |
| 5,040,868 A | | 8/1991 | Waitl et al. | |
| 2004/0075100 A1 | * | 4/2004 | Bogner et al. | 257/99 |
| 2004/0262717 A1 | * | 12/2004 | Arndt et al. | 257/666 |

FOREIGN PATENT DOCUMENTS

| | | |
|---|---|---|
| DE | 10140831 | 3/2003 |
| EP | 0400176 | 12/1990 |
| EP | 0 723293 | 12/1994 |
| EP | 0854523 | 7/1998 |
| JP | 58-147141 | 9/1983 |
| JP | 11-340403 | 12/1999 |
| WO | WO 03/019677 | 3/2003 |

* cited by examiner

*Primary Examiner*—Eddie Lee
*Assistant Examiner*—Colleen Matthews
(74) *Attorney, Agent, or Firm*—Fish & Richardson P.C.

(57) ABSTRACT

A leadframe-based housing for a surface-mountable component, particularly a radiation-emitting component. The leadframe-based housing comprises electrical connector strips and at least one chip mounting area. One of the connector strips includes an injection aperture that enables a leadframe-based housing to be produced with a very small thickness in an injection molding process. A method for producing such housings is further specified.

15 Claims, 6 Drawing Sheets

LEADFRAME-BASED HOUSING, LEADFRAME STRIP, SURFACE-MOUNTED OPTOELECTRONIC-COMPONENT, AND PRODUCTION METHOD

CROSS-REFERENCE TO RELATED APPLICATIONS

This application is the National Stage of International Application No. PCT/DE2003/001906, filed Jun. 10, 2003, which claims the benefit of German Patent Application Serial No. 10234704.2, filed on Jul. 30, 2002. The contents of both applications are hereby incorporated by reference in their entireties.

FIELD OF THE INVENTION

The invention concerns a leadframe-based component housing, a leadframe ribbon with pre-injection-molded component housings, a surface-mountable electronic component, particularly a component comprising a radiation-emitting or radiation-detecting chip, for example a light-emitting diode, also known as an LED, and the method for producing said leadframe-based component housing.

BACKGROUND OF THE INVENTION

The invention concerns electroluminescent diode components suitable in particular for surface-mounting on a printed circuit board, in which a housing base body produced by injection molding and comprising partially embedded electrical connector strips is provided with a recess, preferably implemented as a reflector, that has a radiation window aimed at the front side of the component housing. The recess, in which an electromagnetic-radiation-emitting chip is disposed, is filled for example with an encapsulant that is transparent to the electromagnetic radiation emitted by the chip.

Such component housings are also suitable for use with radiation-detecting chips, in which case the radiation window must be transparent to electromagnetic radiation that is to be received by the chip.

The present patent application claims the priority of German Patent Application 10243247.3, whose disclosure content is hereby incorporated by reference.

The invention is suitable in particular for use with radiation-emitting components in which the chip is installed in a so-called premolded leadframe. This means that each leadframe is overmolded with a housing base body before the chip is mounted.

In the production of such a component housing, the connector strips are first partially stamped into a leadframe ribbon. The leadframe ribbon is then placed in a two-part injection mold which forms a cavity around the leadframe that serves to create the housing base body.

An injection compound, e.g. a white plastic, is then fed in through an injection nozzle, for example via the portion of the injection mold adjoining the back side of the leadframe, i.e. into the portion of the cavity adjoining the back side of the leadframe, and fills the entire cavity of the injection mold.

After the injection compound has at least partially solidified, the injection mold is opened. As the leadframe is removed from the mold, the injection compound located in the injection nozzle is torn away from the injection compound located in the cavity. In addition, the chip is preferably arranged on one of the connector strips in the recess provided for it, connected in an electrically conductive manner to the connector strips and provided with encapsulant. After this, the components interconnected by the leadframe ribbon can be separated from one another and thereby singulated from this interconnected structure.

A radiation-emitting component of the aforesaid kind is described, for example, in EP 0 400 176 A1. The component comprises a housing base body with a mounting area in which a leadframe is partially embedded. Portions of the leadframe are formed as connector strips that project from the housing base body and, as they proceed further, are bent so that their connection areas lie in one plane with the mounting area, which defines the mounting plane of the component.

The overall height of components produced in this manner can be reduced to less than about 1 mm only with high technical outlay, if at all. The minimum height of the front portion of the housing base body is then about 0.5 mm, that of the back wall of the housing base body about 0.3 mm, and the thickness of the connector strips about 0.1 mm.

The reason for this is that the layer thickness of the injection compound located in the cavity between the leadframe and the tear-off site at the injection nozzle must be great enough to prevent delamination between the back side of the leadframe and the injection compound, insofar as possible. Such delamination would drastically increase the risk of damage to the component during further processing or later on during operation. Current knowledge has it that the above-cited layer thickness of the injection compound must be so great that the mechanical tensile forces occurring in the injection compound during tear-off from the injection nozzle can be reduced to a level such that the forces exerted at the boundary with the leadframe are not sufficient to tear the injection compound away from the leadframe.

However, to permit, for example, a very small overall height on printed circuit boards and/or complete countersinking particularly into round openings (bores) in printed circuit boards, the height of the components must be kept as small as possible, and there is a pressing need to reduce the overall height far below the above-cited critical height of about 1 mm. In some applications, especially in mobile communication terminals, the radiation-emitting components should have a much smaller height.

The possibility of reducing the overall height of components by decreasing the height of the housing base body on the chip side is severely limited owing to the final height of the radiation-emitting chip. The possibility of reaching the stated goal by simply reducing the thickness of the housing base body on the back side of the leadframe is also severely limited, since, as explained above, if the layer of injection compound used to form the back side of the housing is too thin, it will easily be torn away with the injection nozzle that is to be removed during the injection process used to produce the housing, in which case the hermeticity and thus the operation of the component can be disrupted.

SUMMARY OF THE INVENTION

It is, therefore, an object of the instant invention to provide a leadframe-based housing for an electronic component, particularly for a radiation-emitting surface-mountable component, that has a very low height; an electronic component of this kind; a leadframe ribbon; and a method for producing a corresponding leadframe-based housing.

This object is achieved by means of a leadframe-based housing, leadframe ribbon, an electronic component having the features as set forth below and a method having the features. from following description. Advantageous improvements of the invention also follow.

A leadframe-based housing according to the invention for a surface-mountable electronic component has the following constituents:

- a leadframe having a front side and a back side and comprising at least two electrical connector strips,
- a housing base body produced in an injection process, preferably injection-molded or transfer-molded, and made from an electrically insulating injection compound,
- a front portion disposed on the front side of the leadframe and a back wall of the housing base body disposed on the back side of the leadframe,
- at least one injection aperture in the leadframe, for apposing or inserting an injection nozzle through which the injection compound is injected onto the leadframe from a back side of the leadframe.

The injection compound thus is injected from the back side of the leadframe through the injection aperture into the portion of the injection mold cavity that creates the front portion of the housing base body on the front side of the leadframe. During injection, the injection nozzle is guided through the portion of the cavity that creates the back wall portion of the housing base body on the back side of the leadframe to the injection aperture of the leadframe. In this fashion, a comparatively large volume of injection compound with a comparatively large cross section is made to be adjacent the injection nozzle and thus the tear-off region of the injection compound at the cavity end of the injection nozzle. The risk of delamination is reduced with this type of housing.

The injection aperture is preferably disposed in one of the electrical connector strips. The back wall, i.e. the plastic wall between the back side of the leadframe and the back side of the housing base body, advantageously has a thickness of 0.3 mm or less, preferably 0.25 mm or less, especially preferably 0.2 mm or less, it being understood that the thickness in each case is greater than 0 mm.

Especially preferably, the invention is suitable for use with components in which at least one recess for receiving a chip, particularly a radiation-emitting or radiation-detecting semiconductor chip, e.g., a light-emitting diode, is provided in the front portion of the housing base body.

The injection aperture in this case is especially preferably arranged in the region of a wall that is part of the front portion and delimits the recess. A large volume of injection compound is advantageously present there by virtue of the structural shape itself.

Provided in the recess is a chip mounting area that is preferably located on one of the two connector strips, but can also be arranged on the housing base body. Such a chip mounting area can also, however, be prepared later on, for example in the form of a carrier plate that is subsequently to be placed in the recess. It is further conceivable to place in the housing base body a thermal connecting base that preferably extends from the floor of the recess through the housing base body to the back side thereof.

Depending on the arrangement of its connection areas, the chip can, for example

- be electrically connected to the electrical connector strips by means of two bonding wires,
- be attached to one contact surface on one of the two connector strips by an electrical connecting means and be connected to the second connector strip by a bonding wire, or
- be mounted in a flip-chip configuration with its connection areas right on the strips.

Still other electrical connection variants are, of course, feasible and will be chosen by the skilled person based on the design of the chip concerned.

In the case of radiation-emitting components, which constitute an especially preferable application for the present invention, the recess comprises a radiation exit window. In this case, the inner surfaces of the recess are preferably implemented as a radiation reflector.

Alternatively, the entire housing can also be made of a radioparent material and can completely encase the radiation-emitting chip.

The injection compound preferably comprises a synthetic material, particularly a temperature-resistant synthetic material filled with white filler. The synthetic material is preferably a thermoplastic material and the filler is preferably titanium oxide and/or barium sulfate.

Suitable materials for encasing the chip in the recess, for example reaction resins such as epoxy resins, acrylic resins, silicone resins and polyurethane resins, are known to those skilled in the art and therefore will not be recited in more detail herein.

The same is true of the injection compound for the housing base body. Likewise, known and commonly used methods for mounting and electrically contacting chips can advantageously be used in this case.

The method of the invention comprises in particular the following steps:

- prestructuring the connector strips and the injection aperture in a leadframe ribbon, for example by stamping, etching or laser cutting, resulting in the formation in the leadframe ribbon of plural adjacently (periodically) arranged component regions each of which will subsequently be provided with a housing base body,
- applying to the leadframe an injection mold that can have two or more parts,
- injecting the injection compound into the injection mold through the injection aperture, the injection nozzle of the injection apparatus being placed against or inserted in the injection aperture,
- at least partial solidification of the injection compound, and
- opening the injection mold and removing the injection nozzle.

In the case of a housing base body comprising a recess for the chip, the inventive injection aperture is particularly preferably located under a solid wall of the housing base body that at least partially surrounds the recess.

The particular advantage of the inventive production method resides in the fact that the overall height of a component housing to be produced thereby can be substantially reduced by means of the particularly thinly constructed back wall of the component housing, especially compared to the heretofore-known radiation-emitting components fabricated by means of premolded leadframes.

The term "leadframe" herein relates in particular to metal leadframes of the kind commonly used in semiconductor optoelectronics, for example for electroluminescent diode housings. However, the term "leadframe" as used herein also encompasses all other leadframes suitable for the inventive housing technology, which need not necessarily be completely of metal and for example can include a combination of electrically insulating material and electrical conductor paths formed thereon. The term "leadframe" in this case is not necessarily to be construed as a continuous ribbon suitable for a "reel to reel" technique. Rather, the leadframe can also, for example, be in the form of strips or arrays.

Further features, advantages and improvements of the invention will emerge from the embodiment examples described hereinbelow in conjunction with FIGS. 1 to 4.

Therein:

BRIEF DESCRIPTION OF THE DRAWINGS

Like or like-acting elements have been given the same reference numerals in the figures.

FIG. 1 is a perspective diagram of a surface-mounted component comprising a housing of prior art.

DETAILED DESCRIPTION OF THE PREFERRED EMBODIMENTS

Figure 1:
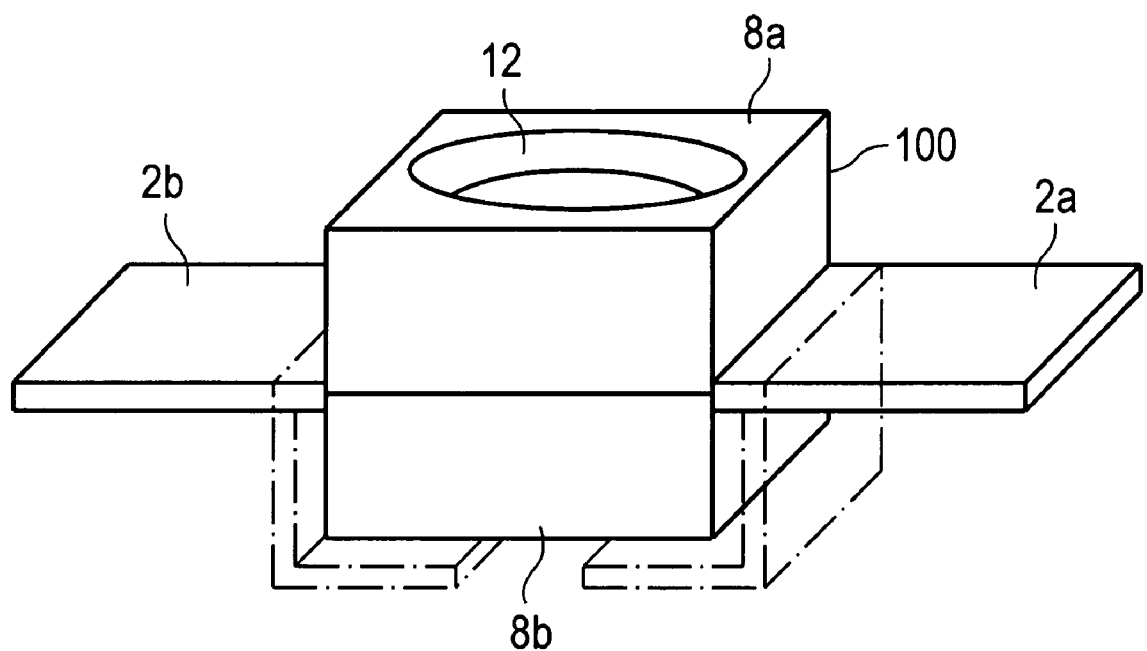
FIG. 1 is a schematic perspective view of a radiation-emitting component of prior art fabricated by the premold technique.

The housing base body of rectangular outline illustrated in FIG. 1 has a front portion 8a and a back wall 8b, a reflector recess comprising a radiation exit window 12 being provided in the front portion 8a. A first connector strip 2a and a second connector strip 2b are partially embedded in the housing base body and are connected to a radiation-emitting chip that is not shown here (it being hidden inside the housing base body). The projecting portions of the connector strips (external contacts) serve for contacting the component, e.g. to an external printed circuit board. The external contacts can extend perpendicularly to the corresponding side wall of the housing or, as indicated in broken lines in FIG. 1, they can be bent around the housing base body.

Figure 2A:
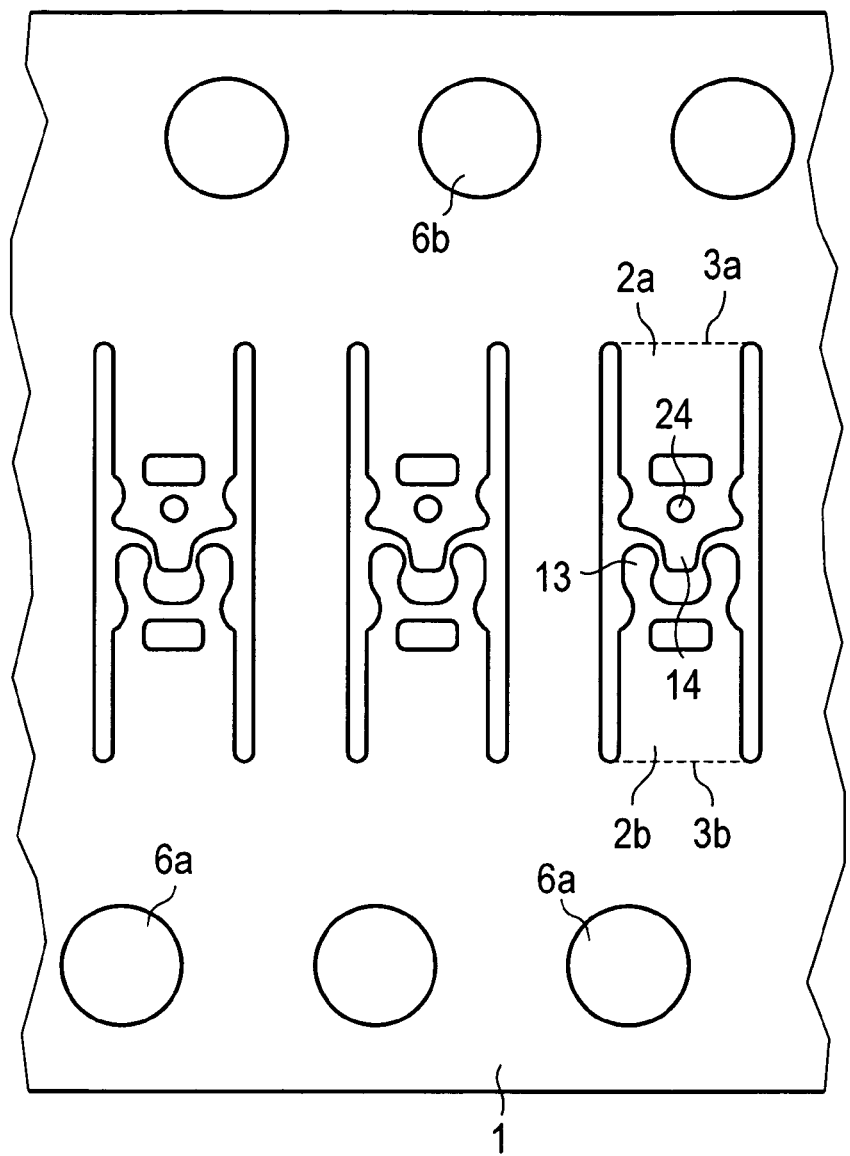
FIG. 2a is a schematic plan view of a leadframe ribbon according to the invention.
Figure 2B:
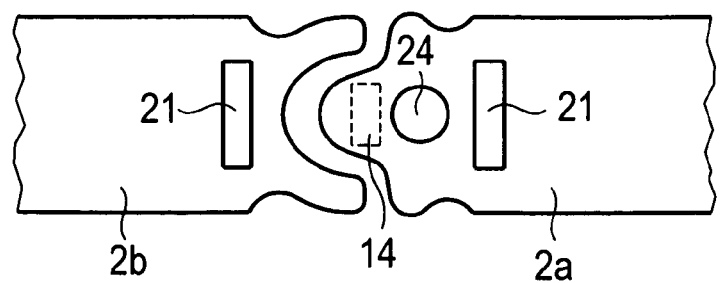
FIG. 2b is an enlarged schematic plan view of two mutually appurtenant connector strips of the leadframe of FIG. 2a, FIG. 2c is a schematic plan view of a leadframe ribbon according to FIG. 2a with inventive housing base bodies formed by injection molding.

The leadframe ribbon 1 according to the embodiment example of FIGS. 2a and 2b is prestructured, for example by stamping, and comprises in particular a plurality of first connector strips 2a and a plurality of second connector strips 2b, which are separated from the leadframe ribbon along lines 3a and 3b, respectively, in a subsequent method step.

Contact strips 2a and 2b are intended respectively as the cathode and anode connections of the components to be produced. Additional structures (e.g. heat-conducting strips) can also be provided on the leadframe ribbon. In this embodiment example, a chip mounting area 14 for a chip is provided on connector strip 2a and a wire connecting area 13 for a bonding wire is provided on connector strip 2b. Provided according to the invention on first connector strip 2a is an injection aperture 24 into which an injection nozzle can be inserted during the creation of a housing base body by injection molding. The injection aperture can alternatively be provided in second connector strip 2b. It is advantageous for each injection aperture to be provided under a respective side wall, of the housing base body, that is to be formed later on.

Chip mounting area 14 and wire connecting area 13 of the leadframe ribbon respectively extend (in the finished housing base body) into a provided reflector recess or have one surface that is contiguous at least with the interior of the recess, and thereby form at least part of the floor of the recess. To further reduce the size of the housing base body, a separate recession leading to the wire connecting region can additionally be formed in the reflector recess. These aspects can discerned in FIG. 3c.

Further formed in leadframe ribbon 1 are circular openings 6a and 6b for guiding and transporting the leadframe ribbon.

In addition, connector strips 2a and 2b preferably comprise rectangularly shaped openings 21 suitable for relieving loads on the component housing during the bending of the connector strips (see FIG. 1) or anchoring the connector strips in the component housing.

Figure 2C:
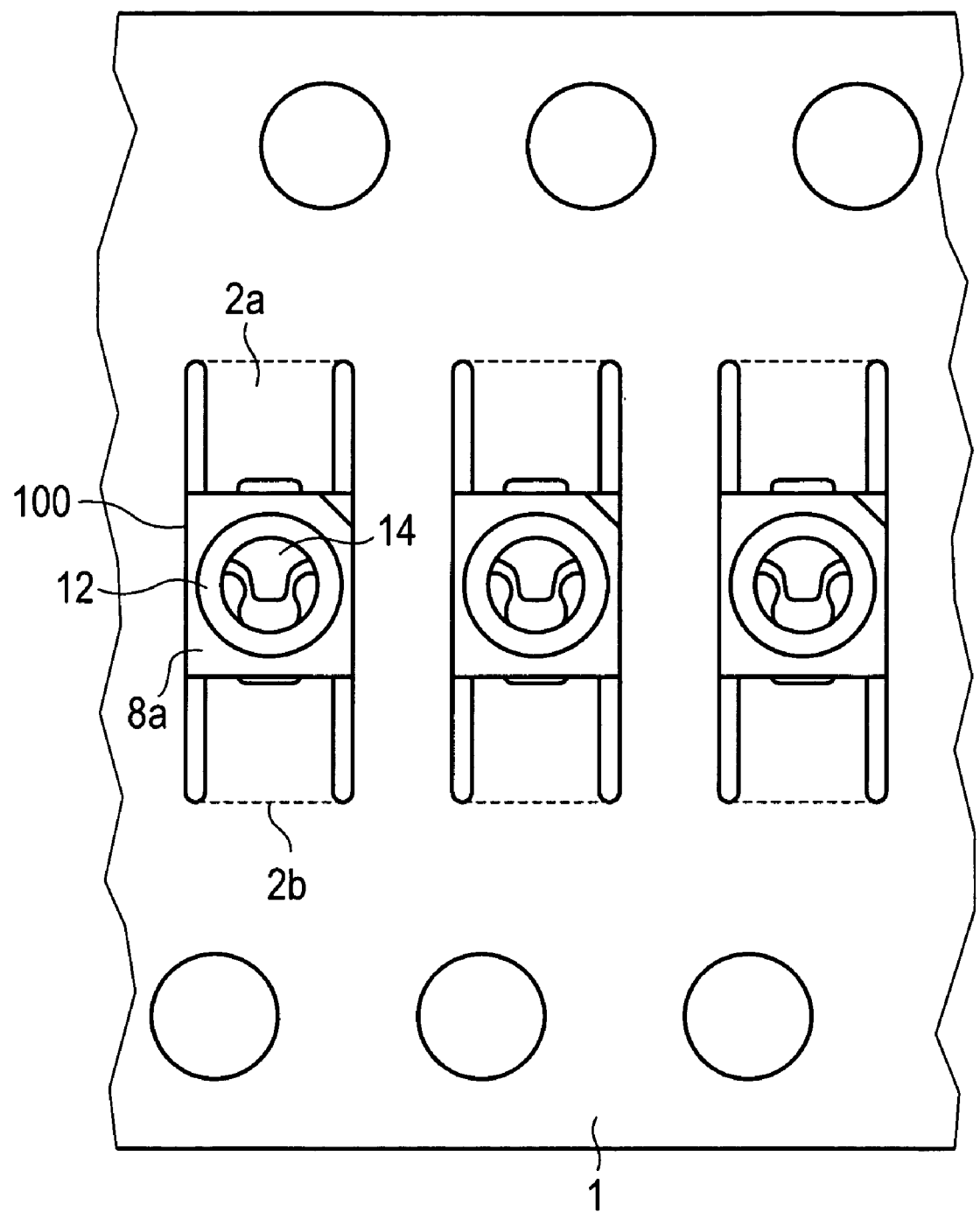

FIG. 2c shows the leadframe ribbon 1 with a housing base body 100 produced according to the invention by an injection method and comprising in each case a chip mounting area 14 and a recess leading to each of said chip mounting areas.

Figure 3A:
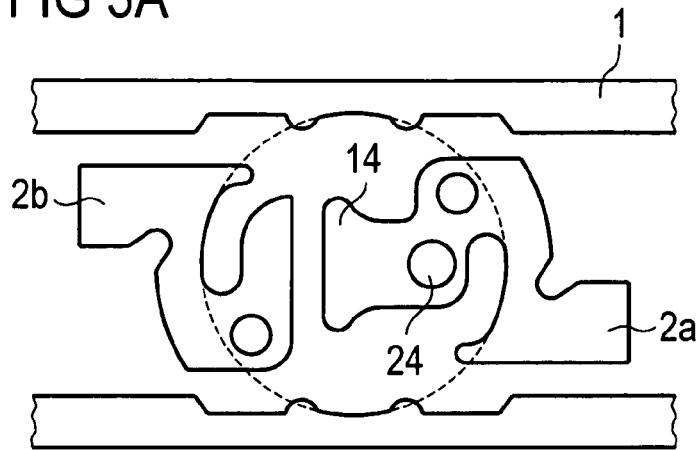
FIG. 3a is a schematic diagram of the plan view of a further embodiment example of the connector strips of an inventive component.

The embodiment example illustrated in FIG. 3a, representing a leadframe of an inventive housing and component of substantially circular outline, comprises sickle-shaped connector strips that serve to improve the anchoring of the connector strips in the housing base body and to provide elastic strain relief during the bending of the connector strips. This leadframe as well comprises an injection aperture 24, disposed next to a chip mounting area 14, into or in apposition to which an injection nozzle can be guided from the back side of the leadframe to produce the housing base body.

Figure 3B:
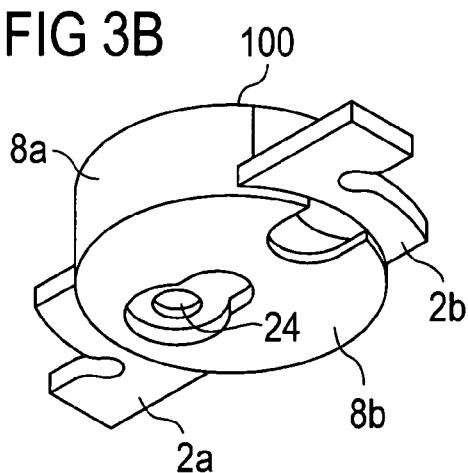
FIG. 3b is a schematic diagram of the perspective bottom view of an inventive housing base body with a leadframe according to FIG. 3a, FIG. 3c is a schematic diagram of the perspective view from above of a housing base body according to FIG. 3b, FIGS. 4a and 4b are schematic diagrams of a cross section through, respectively, a housing base body of a component or prior art (4a) and a component according to the invention (4b) during the injection of the housing base body.
Figure 3C:
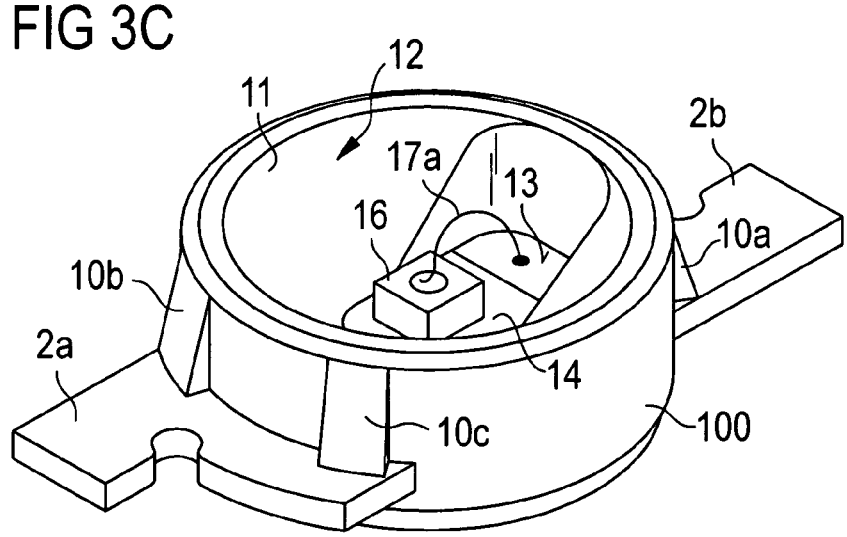

FIG. 3b shows an inventive housing base body 100 of substantially circular outline in a perspective view from below. Visible here is the injection aperture 24, through which the housing base body 100 is injected into the cavity of a suitable injection mold into the portion of the cavity adjoining the front side of the leadframe. In other respects, the front portion of housing base body 100 is configured as illustrated in FIG. 3c, for example. This type of housing is particularly suitable for the production of surface-mountable radiation-emitting and/or radiation-detecting components comprising LED and/or photodiode chips that can be at least partially sunk into circular openings in printed circuit boards or the like.

The component depicted in FIG. 3b is shown in a perspective view in FIG. 3c. A radiation-emitting chip 16, for example an LED chip, is fastened in a reflector opening, for example on connector strip 2a. A metallic solder or a conductive adhesive, for example, is used as the connecting means. A second contact of the LED chip is electrically connected to connector strip 2b, for example by means of a bonding wire 17a. The side wall 11 of a recess, which connects the floor of the recess to the outer surface of housing base body 100, is implemented so that it acts as a reflector surface for electromagnetic radiation emitted by the chip 16. It can advantageously be shaped as planar, concave or otherwise, depending on the desired radiating behavior. The projections 10a, 10b and 10c on the housing base body that can be seen in FIG. 3c serve to guide the connector strips located outside the housing base body. They can additionally serve as insertion bevels for inserting the housing into openings in a printed circuit board.

On the front side, which faces away from the connector strip, the chip 16 has a contact area from which an electrical connecting line 17 (e.g. a wire connection) is led to wire connecting part 13.

Figure 4A:
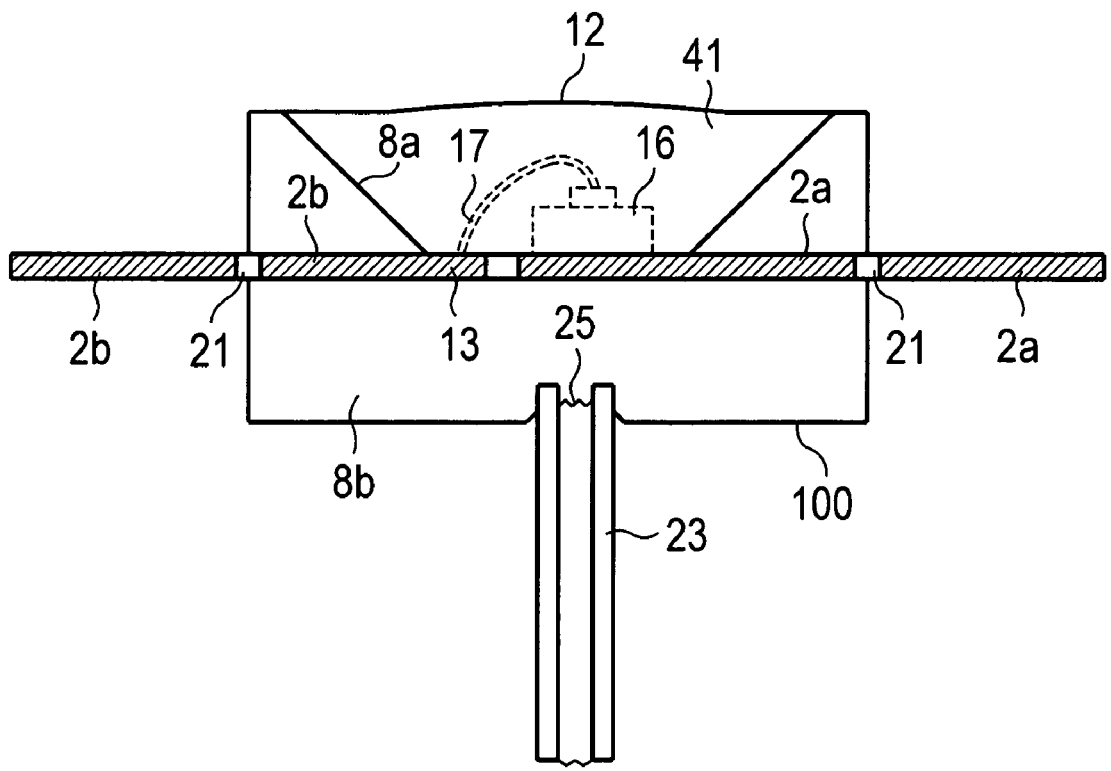
Figure 4B:
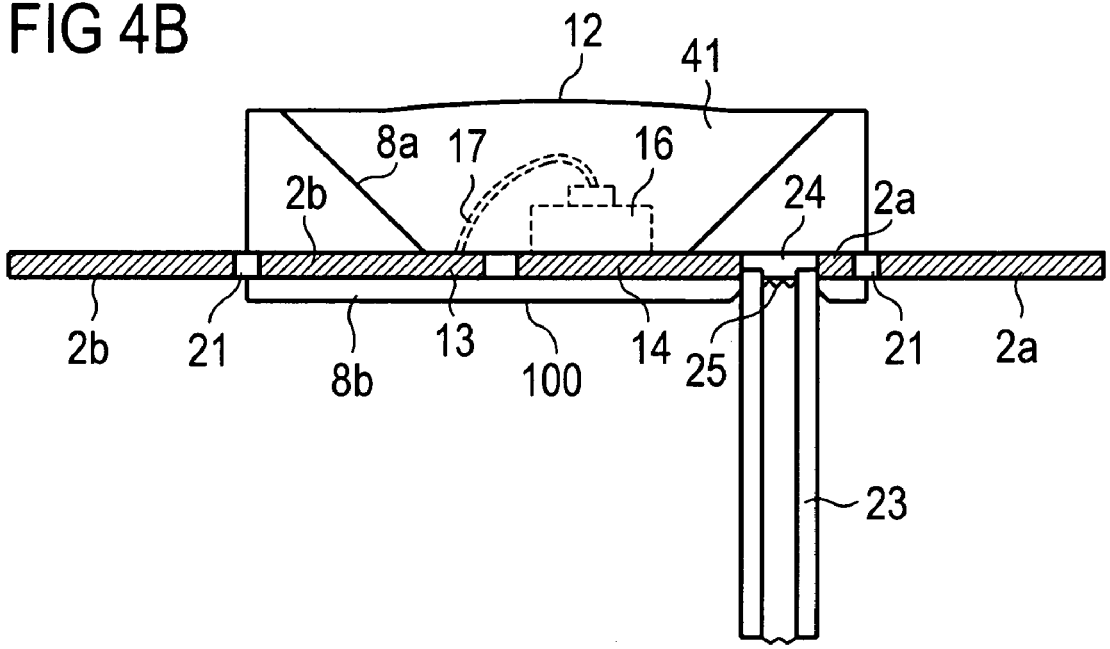

The particular advantage of the invention is made immediately apparent by the comparison of the prior art and the invention illustrated in FIGS. 4a and 4b.

The front portion 8a of housing base body 100, which is intended, for example, for the subsequent mounting of an LED chip, has in both cases a reflector recess in the form of a frustum-of-a-cone-like opening that broadens in the direction of the main radiation direction and possesses a radiation exit window 12. The reflector recess is filled with a transparent encapsulant 41.

A chip 16 to be inserted in a subsequent process step and an electrical connecting line 17 are depicted schematically in dashed lines.

The oblique side face 11 of the recess preferably serves as a reflector.

The housing base body 100 is made by means of a two or more part injection mold that has a cavity for housing base body 100 in which the leadframe is placed during the injection process. The cavity of the injection mold is filled with an injection compound for the housing base body by means of an injection nozzle 23.

The difference between the prior art and the inventive arrangement of the injection nozzle lies in the position of the injection nozzle 23. In the prior art, the injection compound is injected into the volume adjacent the back side of the leadframe. After the injection compound has solidified, the injection nozzle is detached from the injection mold. This produces a tear-off site 25. During the detachment of the injection nozzle, the region near the tear-off site is subjected to severe mechanical loading that can lead to delamination of the material of the (solidified) injection compound at the interface between the back wall 8b of the housing base body and connector strips 2a and 2b. Thus, back wall 8b can easily become damaged if its height is very small. To prevent this insofar as possible, the back wall 8b of the housing base body must have a relatively large thickness.

In a leadframe-based housing according to the invention, by contrast, the injection nozzle 23 is not inserted in the central region of a cavity suitable for producing the back wall 8b of the housing base body, but is placed against an injection aperture 24 disposed laterally in the leadframe, or is inserted into said injection aperture 24. The tear-off site 25 thus is not located opposite the leadframe, but is instead adjacent the volume of injection compound constituting the solid side wall of the housing base body. This makes it possible to produce the back wall 8b of housing base body 100 with a minimal thickness, and thus a component having a minimal overall height. A back wall thickness of less than 0.3 mm, for example 0.1 mm, can be attained.

Due to the very small height of the back side of an inventive component, formed by the back wall of the housing base body, the space occupied by the component in the vertical direction is much smaller than that of a component of prior art. The inventive component is suited in particular for flat display modules or as background illumination, for example for a liquid crystal display.

Figure 5A:
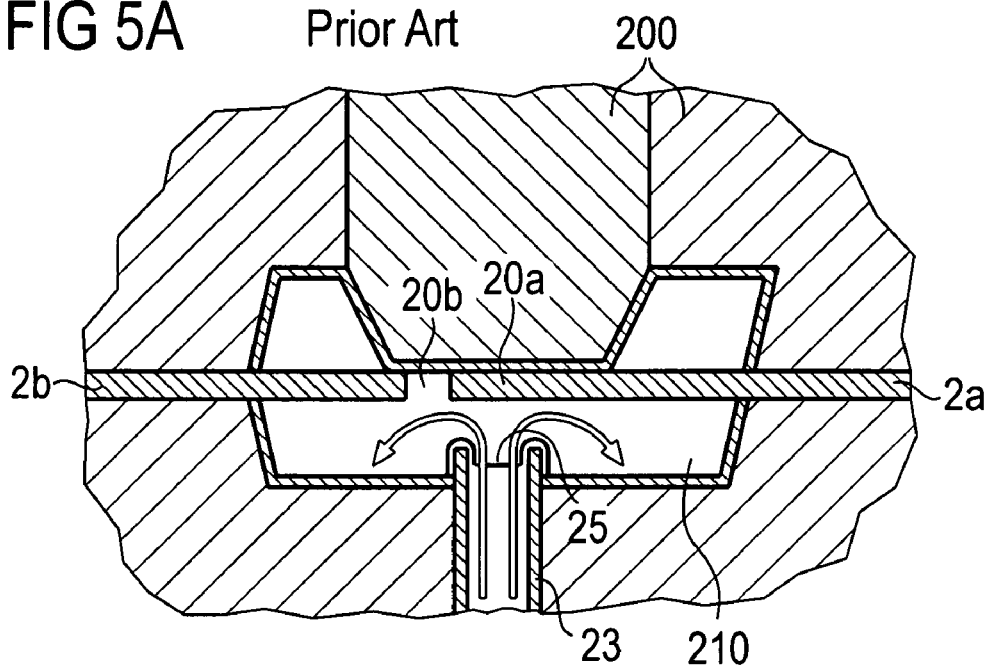
FIGS. 5a and 5b are schematic diagrams of a cross section through, respectively, a housing base body of a component of prior art (5a) and a further embodiment of a component according to the invention (5b) during the injection of the housing base body.
Figure 5B:
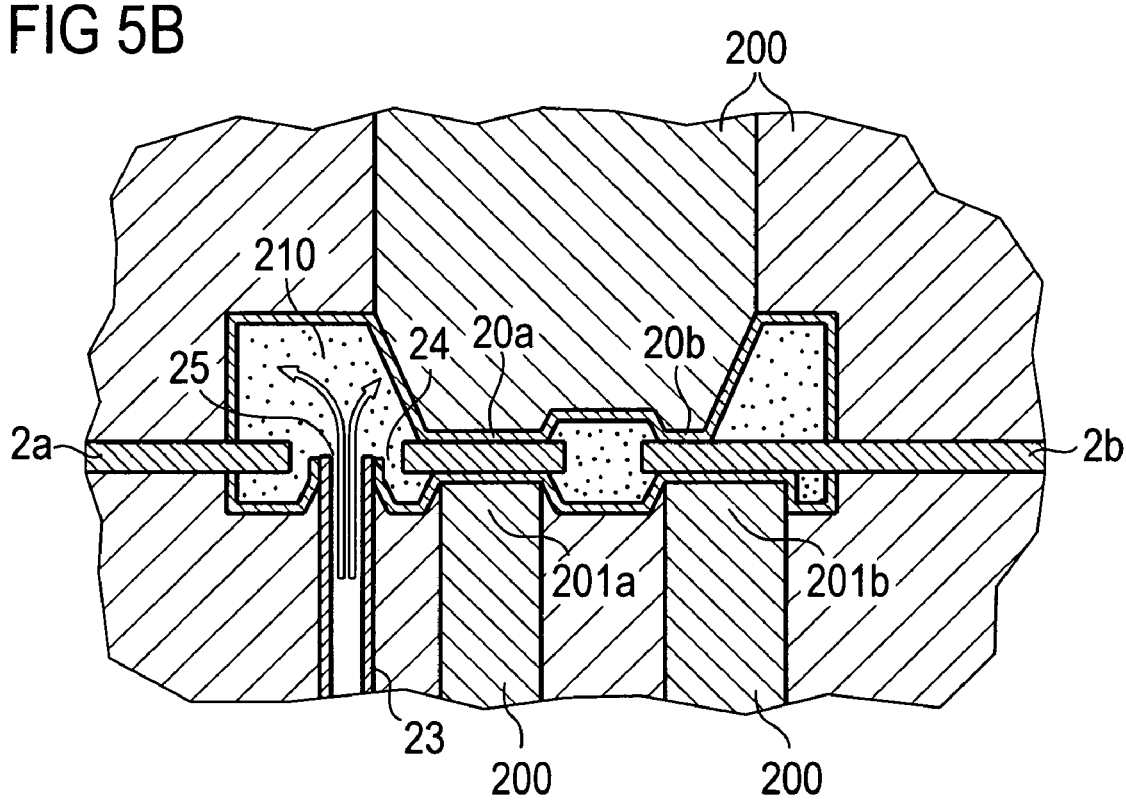

FIGS. 5a and 5b each illustrate an injection mold 200 comprising a cavity 210. In the fabrication of a housing base body, it is important that electrical connection areas 20a and 20b of connector strips 2a and 2b, which are intended to place a chip in electrically conductive contact with connector strips 2a and 2b, not be covered with injection compound.

In the injection mold 200 of prior art illustrated in FIG. 5a, the injection compound is injected from below through injection nozzle 23 toward connector strips 2a, 2b, causing connector strips 2a, 2b comprising electrical connection areas 20a and 20b to be pressed against the injection mold (the path of the injection compound during injection is indicated by arrows). This seals off connection areas 20a, 20b insofar as possible, thus reducing the risk of connection areas 20a, 20b being covered with injection compound.

By contrast, in an injection mold 200 for a component housing according to the invention, as illustrated in FIG. 5b, the injection compound is injected into the cavity 210 via the injection aperture 24 in such fashion that no pressing of the connection areas 20a and 20b against the injection mold as described in the preceding paragraph occurs. There is instead a risk that the connector strips 2a, 2b and thus the connection areas 20a, 20b will be pushed away from the injection mold and a gap will form between the upper inside wall of the injection mold and connection areas 20a, 20b, which will then cause connection areas 20a, 20b to be covered (the path of the injection compound during injection is again indicated by arrows).

To keep connection areas 20a, 20b from being pushed away from the upper inside wall of the injection mold 200 during the procedure according to the invention, an injection mold 200 for a component housing according to the invention (cf. FIG. 5b) is shaped so that in the closed state, with connector strips 2a, 2b clamped inside, it also abuts, with an inner face, the surfaces of connector strips 2a, 2b opposite connection areas 20a, 20b. Connector strips 2a, 2b are thereby pressed, in a region of connection areas 20a, 20b, against sections 201a and 201b of the appurtenant inner wall of the injection mold in such fashion that they are sealed off. Such an injection mold 200 for producing an inventive component housing therefore greatly reduces the risk that connection areas 20a, 20b will become covered with injection compound during the transfer molding of a housing base body.

A housing base body produced with an injection mold 200 of this kind comprises recessions in the back wall of the housing base body in regions of connector strips 2a, 2b located opposite connection areas 20a, 20b. The surfaces of connector strips 2a, 2b that are outwardly bare in these regions can be electrically insulated outwardly later on. This can be done, for example, by coating them with an electrically insulating material, for example electrically insulating varnish.

The description of the invention with reference to the illustrated embodiment examples is naturally not to be construed as a limitation of the invention. For example, the chip can be mounted—adhesive-bonded, for example—directly on a chip mounting area of housing base body 100, and the chip can be electrically connected to the connector strips by means of wire connections alone. The chip can also be mounted on a separate thermal connector embedded in the housing of the component and again be connected electrically to the leadframe via wire connections. Other variants of the chip mounting technique that are not described here can also be used. None of these embodiments departs from the basic ideas of the instant invention. The invention is not limited to the number or particular implementations of the embodiment examples illustrated in the figures. Rather, the invention encompasses any novel feature and any combination of features that includes in particular any combination of features recited in the claims, even if this combination is not stated explicitly in the claims.

The invention claimed is:

1. A surface-mountable leadframe-based housing for an electronic component, with a leadframe having a front side and a back side and comprising at least two electrical connector strips, and an injection-molded or transfer-molded housing base body made from an electrically insulating injection compound and comprising a front portion disposed at the front side of said leadframe and a back wall disposed at the back side of said leadframe, wherein said leadframe comprises at least one injection aperture through which said housing base body is injected onto said leadframe from a back side of said leadframe, and wherein the back wall of the housing base body includes a first recess that extends from said injection aperture.

2. The housing as described in claim 1, wherein said injection aperture is disposed in one of said electrical connector strips.

3. The housing as described in claim 1, wherein said back wall has a thickness of less than 0.3 mm and more than 0 mm.

4. The housing as described in claim 1 for a radiation-emitting and/or radiation-detecting component, wherein said housing base body comprises in said front portion a second recess for receiving a radiation-emitting and/or radiation-detecting chip, said injection aperture being disposed in the region of a wall of said front portion delimiting said second recess.

5. The housing as described in claim 4, wherein said second recess is formed as a reflector.

6. The housing as described in claim 4, wherein said second recess is filled with an injection compound that is transparent to radiation emitted by and/or to be detected by said chip.

7. The electronic component comprising a housing with reference to claim 4, wherein said second recess is filled with an injection compound that is transparent to radiation emitted by and/or to be detected by said chip.

8. A leadframe ribbon comprising at least one housing as described in claim 1.

9. An electronic component having a housing as described in claim 1, which comprises at least one chip.

10. The electronic component as described in claim 9, wherein said at least one chip is a radiation-emitting and/or radiation-detecting chip.

11. The electronic component as described in claim 9, wherein said chip is disposed on one of the two connector strips and is electrically connected to the second connector strip by means of an electrical connecting line.

12. The electronic component as described in claim 9, wherein said chip is disposed on a mounting area of said housing base body and is electrically connected to each of said electrical connector strips by means of in each case one electrical connecting line.

13. The electronic component as described in claim 9, wherein said chip is disposed on a thermally well-conducting chip carrier leading through said housing base body to the back side and is electrically connected to each of said electrical connector strips by means of in each case one electrical connecting line.

14. A method for producing a lead frame-based housing, comprising:
   a) providing a lead frame having a front side and a back side, the lead frame comprising two connector strips, at least one of the connector strips having an injection aperture,
   b) applying to said lead frame an injection mold that forms around said lead frame a cavity for creating a housing base body having a back wall that includes a first recess that extends from said injection aperture and placing an injection nozzle proximate to said injection aperture,
   c) injecting an injection compound into said cavity from the back side of the lead frame,
   d) causing the injection compound to at least partially solidify, and
   e) removing the injection nozzle and opening the injection mold.

15. The method as described in claim 14, wherein a thermoplastic material is used as the injection compound.

* * * * *